United States Patent [19]
Bigler et al.

[11] Patent Number: 5,455,200
[45] Date of Patent: Oct. 3, 1995

[54] METHOD FOR MAKING A LEAD-ON-CHIP SEMICONDUCTOR DEVICE HAVING PERIPHERAL BOND PADS

[75] Inventors: Charles G. Bigler; James J. Casto; Michael B. McShane; David D. Afshar, all of Austin, Tex.

[73] Assignee: Motorola, Inc., Schaumburg, Ill.

[21] Appl. No.: 97,505

[22] Filed: Jul. 27, 1993

Related U.S. Application Data

[62] Division of Ser. No. 829,870, Feb. 3, 1992, abandoned.

[51] Int. Cl.[6] .................................................. H01L 21/60
[52] U.S. Cl. ...................... 437/220; 437/209; 437/217; 228/180.5; 228/4.5; 228/904; 257/666; 257/667; 257/672; 257/676
[58] Field of Search ..................... 257/666, 667, 672, 673, 676, 775, 776; 437/220, 209, 217; 228/180.5, 4.5, 904

[56] References Cited

U.S. PATENT DOCUMENTS

| | | | |
|---|---|---|---|
| 3,685,137 | 8/1972 | Gardiner | 29/471.3 |
| 4,583,676 | 4/1986 | Pena et al. | 228/179 |
| 4,595,945 | 6/1986 | Graver | 357/70 |
| 4,600,138 | 7/1986 | Hill | 228/179 |
| 4,612,564 | 9/1986 | Moyer | 357/70 |
| 4,796,078 | 1/1989 | Phelps, Jr. et al. | 357/68 |
| 4,821,945 | 4/1989 | Chase et al. | 228/179 |
| 4,862,245 | 8/1989 | Pashby et al. | 357/70 |
| 4,916,519 | 4/1990 | Ward | 357/70 |
| 4,937,656 | 6/1990 | Kohara | 357/70 |
| 4,943,843 | 7/1990 | Okinaga et al. | 357/70 |
| 4,965,654 | 10/1990 | Karner et al. | 357/70 |
| 4,987,474 | 1/1991 | Yasuhara et al. | 357/70 |
| 4,989,068 | 1/1991 | Yasuhara et al. | 357/72 |
| 5,035,034 | 7/1991 | Cofney | 228/179 |
| 5,193,733 | 3/1993 | You | 228/47 |
| 5,252,854 | 10/1993 | Arita et al. | 257/676 |
| 5,284,725 | 2/1994 | Takatsu | 437/220 |

OTHER PUBLICATIONS

"Packaging Technology for Thin, High Density and High Speed Devices," by G. Murakami et al., Hitachi Review, vol. 40, No. 1, Feb. 1991, pp. 51–56.

"... 2 ... 16M DRAM ... LOC ... ," published in Nikkei MicroDevices in Nov., 1991, pp. 79–83. Original plus translation.

"DRAM, SRAM ... LOC ... 16M DRAM, 4M ... SRAM ... ," published in Nikkei MicroDevices in Feb., 1992, pp. 77–84, Original plus translation.

Primary Examiner—Olik Chaudhuri
Assistant Examiner—Long Pham
Attorney, Agent, or Firm—Patricia S. Goddard

[57] ABSTRACT

A semiconductor device (10) has a lead-on-chip (LOC) configuration. Leads (24) of the device have central portions (36) which are electrically coupled to peripheral bond pads (14) by conductive wires (30). Inner portions (38) of the leads extend from the central portions toward centerline A—A for improved adhesion and to provide an internal clamping area (41) which stabilizes the leads during wire bonding. In one embodiment, tie bar (22) of leadframe (16) is used to distribute power across semiconductor chip (12). The leadframe may also include chip alignment features (50) and tape alignment features (52) to align chip (12) and insulating tape (18) to the leadframe, respectively.

18 Claims, 3 Drawing Sheets

METHOD FOR MAKING A LEAD-ON-CHIP SEMICONDUCTOR DEVICE HAVING PERIPHERAL BOND PADS

This is a divisional of application Ser. No. 07/829,870, filed Feb. 3, 1992, now abandoned.

FIELD OF THE INVENTION

The present invention relates to semiconductor devices in general, and more specifically to lead-on-chip semiconductor devices and methods for making the same.

BACKGROUND OF THE INVENTION

Lead-on-chip (LOC) is a packaging technique employed by several semiconductor manufacturers, particularly those whose make semiconductor memory devices, including DRAMs (dynamic random access memories) and SRAMs (static random access memories). Conventional LOC devices have a plurality of leads which are disposed on and attached to an active surface of a semiconductor chip, thus the name lead-on-chip. A primary advantage of LOC is that the ratio between the size of the semiconductor chip and the size of a package which encapsulates that chip is quite high. This advantage is achieved because a chip mounting area, also known as a flag or a die pad, is not required since the chip is instead attached to the leads. The chip size to package size ratio is an important factor to semiconductor manufacturers because customers continue to demand smaller and smaller devices.

While LOC is an attractive packaging alternative in some regards, many proposed LOC schemes are not flexible enough to accommodate various chip designs. For instance, much of the existing LOC technology requires bond pads of a semiconductor chip to be located in a central row of the chip. Several semiconductor manufacturers, however, have existing chip designs which have peripheral bond pads. Other LOC techniques have been developed for chips with bond pads on two opposing end of a chip. Nonetheless, these techniques are not applicable to chips have bond pads distributed around the entire periphery of the chip. In order to benefit from the advantages of LOC, semiconductor manufacturers must re-design the peripheral bond pad chips to have end-only bond pads or centrally located bond pads. Chip re-designs are costly and time-consuming. Furthermore, re-designing the chip may result in a chip which is larger than the originally designed chip. As another example, some semiconductor manufacturers design a chip so that the chip can be packaged using any one of several techniques rather than having to re-design the chip for each type of package. A common case is a chip which is designed to be packaged using either a metal leadframe or a TAB (tape automated bonding) leadframe. Much of the existing LOC technology is directed solely to the use of metal leadframes and cannot be implemented in TAB.

SUMMARY OF THE INVENTION

The present invention overcomes many of the disadvantages associated with the prior art. In one form, a semiconductor device in accordance with the present invention has a semiconductor chip having a periphery, an active surface, and a centerline. A plurality of bond pads are formed on the active surface of the chip along the periphery. A plurality of leads overlies the active surface and the chip such that the leads are spaced between the bond pads. Each lead has a central portion which is electrically coupled to one of the bond pads by a conductive wire. Each lead also has an inner portion which extends from the central portion toward the centerline of the chip.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

The present invention provides chip design flexibility to semiconductor manufacturers. In one form of the invention, a semiconductor chip has peripheral bond pads and uses a lead-on-chip (LOC) concept. Leads extend across an active surface of chip between the bond pads to accommodate the peripheral bond pads. In addition, leads extend well beyond the bond pads, toward a centerline of the package, in order to increase lead surface area. Increasing lead surface area has at least two advantages. One advantage is that a larger surface area improves adhesion between the leads and the chip, and between the leads and a molded resin package body. Another advantage is that a larger lead area also improves dissipation of heat from the active chip surface to the ambient through the thermally conductive leads. Although the leads of a semiconductor device in accordance with the present invention extend beyond the bond pads, wire bond lengths are kept short because wire bonds are made to a central portion of the leads as opposed to lead tips. Short wire bonds reduce the probability of wire sweep during a package molding procedure and also lower the probability of electrically short circuiting two wires or short circuiting a wire to an inappropriate lead. Each of these advantages and other desirable features of the present invention are described in more detail below.

Figure 1:
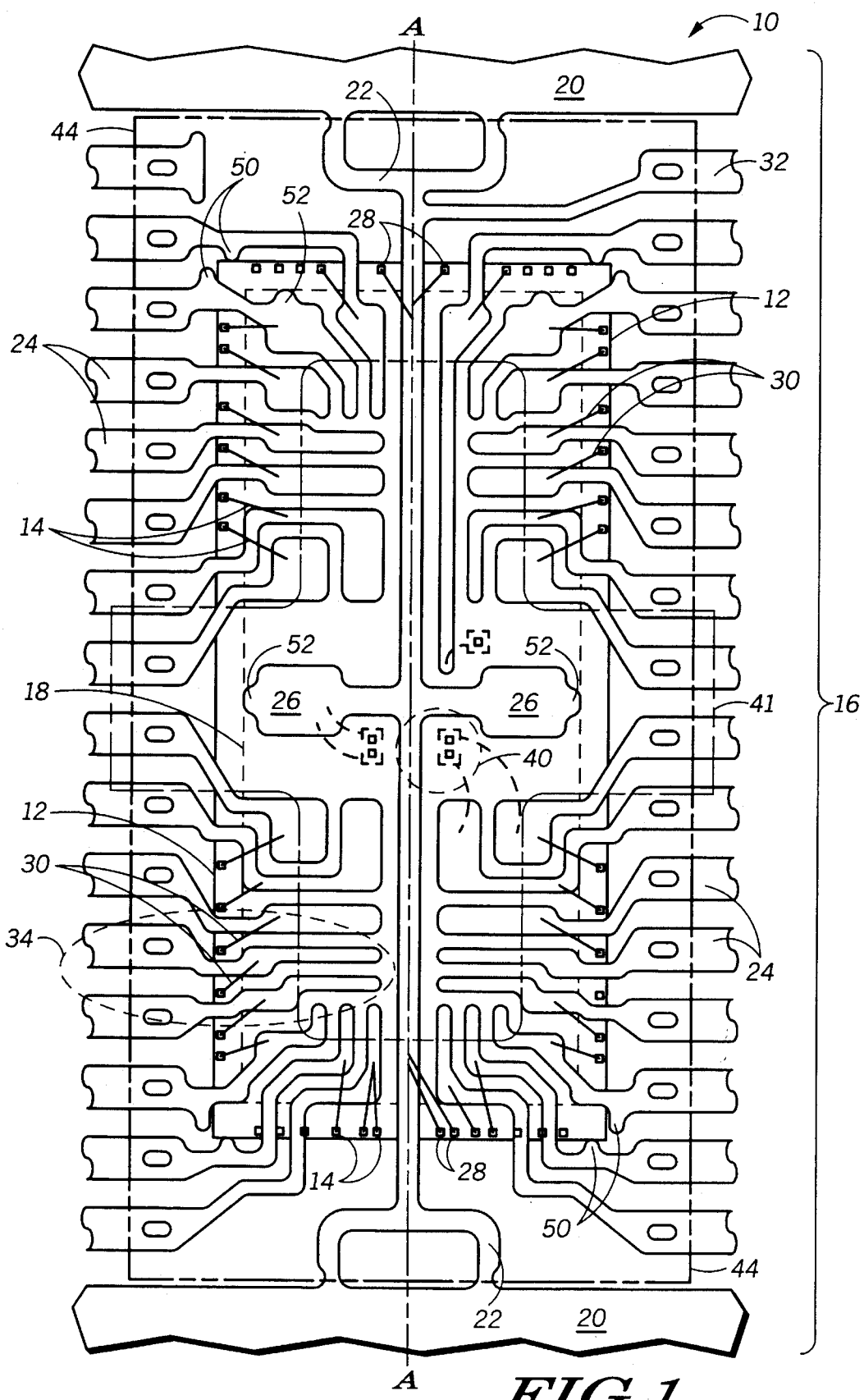
FIG. 1 is a plan view of a semiconductor device in accordance with one embodiment of the present invention.

FIG. 1 illustrates in plan view a semiconductor device 10 in accordance with the present invention. Device 10 includes a semiconductor chip 12. An active surface of the chip is illustrated, and includes a plurality of bond pads 14 positioned along a periphery of the chip. The chip has four sides, two of which are much longer than other two. This rectangular chip shape is common in semiconductor memory devices. It is to be understood, however, that the present invention may be practiced with other device types, such as gate arrays, microprocessors, analog devices, and the like. The active surface of semiconductor chip 12 is bonded to a leadframe 16 by an insulating tape 18 having an adhesive layer or adhesive coating on each major side. The double-sided adhesive insulating tape is used to bond leads 14 to chip 12. Insulating tape 18 may be any of the commercially available tapes used in conventional LOC packaging. Commonly used insulating tapes are often polymers, such as a polyimide material. Adhesive materials may also be a polyimide, or may be an epoxy, an acrylic, a variant of these materials, or the like.

Only a portion of leadframe 16 is illustrated in FIG. 1. Those portions illustrated include rail portions 20, tie bar 22, and a plurality of leads 24. In a preferred embodiment of the present invention, leadframe 16 is in strip form so that multiple semiconductor chips can be attached to one leadframe. However, for purposes of understanding the present invention, it is necessary only to show the leadframe portions associated with one semiconductor chip. Leadframe 16 is formed of materials which are used in conventional leadframes, for instance copper, a copper alloy, an iron-nickel alloy, or the like.

As illustrated in FIG. 1, tie bar 22 extends along a centerline A—A of chip 12 and joins opposing rail portions 20 of leadframe 16. Tie bars in a conventional leadframe are used to suspend a chip mounting area, also known as a flag or a die pad. LOC leadframes do not require a die pad since a chip is attached to leads. In one embodiment of the present invention, however, a tie bar serves two other purposes. First, tie bar 22 of leadframe 16 provides additional surface area to adhere to chip 12 and to adhere a molded resin material which will eventually form a package body (not shown). If necessary, tie bar 22 can be modified to include support members 26 for additional surface area and improved adhesion. Another purpose in having tie bar 22, in accordance with the present invention, is that the tie bar can also be used to distribute voltage in the device. In a preferred embodiment of the invention, tie bar 22 is used for power distribution, however any voltage may be distributed throughout the device. As illustrated in FIG. 1, tie bar 22 is electrically coupled to bond pads 28 by conductive wires 30. A lead 32 is integral to tie bar 22. Thus, a voltage supplied to lead 32 is distributed across the chip by the tie bar. Although device 10 has two bond pads 28 at each of two sides of chip 12 which are electrically coupled to the tie bar, this is not a requirement of the invention. Voltage distribution can be achieved by having one or more bond pads and one or more leads electrically coupled to the tie bar in accordance with the present invention. Furthermore, more than one tie bar may be used for voltage distribution purposes. Although FIG. 1 illustrates tie bar 22 as distributing voltage from one end of chip 12 to another, a tie bar may distribute voltage to and from any portion of a chip in accordance with the present invention. For example, a voltage bond pad could be electrically coupled to one of the support members 26 of FIG. 1 by a wire bond to distribute voltage from the center of the chip to another portion of the device.

Leads 24 of leadframe 16 each have three different portions in accordance with the present invention. A lead of FIG. 1 highlighted by a region 34 is illustrated in an exploded view in FIG. 2 to more clearly point out each of the three lead portions. Lead 24 has a central portion 36 to which is bonded a conductive wire 30. Dimensions of central portion 36 should be sufficient to provide a reasonable bonding target area during bonding of the conductive wires.

Figure 2:
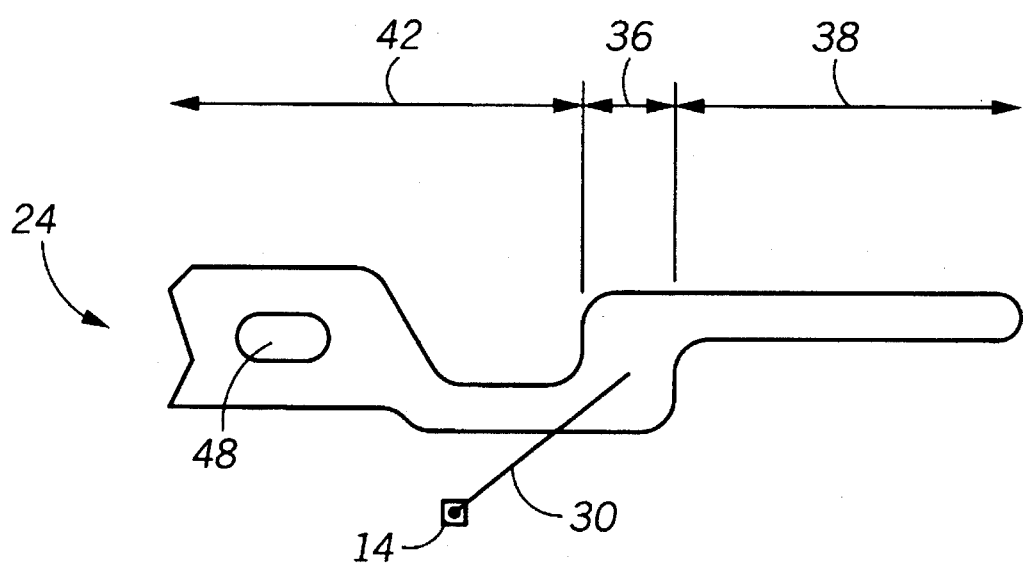
FIG. 2 is an exploded view of region 34 of FIG. 1.

An inner portion 38 of lead 24 is a second lead portion and is also illustrated in FIG. 2. Inner portion 38 extends from central portion 36 toward centerline A—A of chip 12 as illustrated in FIG. 1. Conventional leadframes bond a conductive wire to a tip of a lead rather than to a central portion. By extending the lead beyond the bonded portion toward the center of the chip, more lead surface area is provided and adhesion of the lead to insulating tape 18, chip 12, and a molded resin package body (not shown) is improved. Also, chip 12 may include bond pads which are located near the middle of the chip rather than along the chip periphery. In this case, a conductive wire can be bonded to inner lead portions 38 to accommodate the internal bond pads, as illustrated in region 40 of FIG. 1. In one embodiment of the present invention, inner portions 38 are made wider than other portions of the leads to further improve adhesion.

Yet another benefit of inner portions 38 is that the inner portions of the leads can be used as a clamping area during wiring bonding. In wire bonding conductive wires between leads of a leadframe and bond pads of a semiconductor chip, it is important that the leads be held still to ensure proper bonding. As part of a leadframe, leads are relatively long cantilevers which can easily be flexed. To prevent flexing of the leads during bonding, and to prevent movement of the leadframe in general, outer portions of the leads are typically held down by a clamping tool of a wire bonding apparatus. The clamping tool is designed to permit access to a semiconductor chip and to bonding portions, most often the tips, of the leads. The clamping area of a leadframe most often encircles, and is spaced apart from, a semiconductor chip. For example, the region beyond a package outline 44 might represent a conventional clamping region. With respect to LOC packaging techniques, however, conventional clamping methods often do not provide sufficient lead stability. Because LOC leadframes have leads which extend over a chip, the portion of the lead not clamped by a peripheral clamping tool is longer in comparison to other leadframe designs. The longer the unclamped portion of the lead, the easier it is for the lead to move during the wire bond operation.

In an embodiment of the present invention, inner lead portions 38 are used as a clamping area. One possible clamping area is defined in FIG. 1 as clamping area 41. Clamping area 41 is in the shape of a cross; however, this is not a requirement of the present invention. Any amount or portion of the inner portions 38 of leads 24 can be used as a clamping area in accordance with the present invention. In clamping leadframe 16 during a wire bond operation, it is important that all bond pads and all lead portions which are to be bonded are accessible. For example, if using a clamping tool having clamping area 41, one would not be able to include the internal bond pad of region 40 illustrated in FIG. 1 since this region would be clamped. By clamping the leadframe along clamping area 41, the cantilevered ends of leads 24 are securely stationed near the central bonding portions 36 of the leads. In clamping the leadframe in a region overlying the active chip surface, it is also important that pressure applied by the clamping tool does not damage the chip.

A third portion of each lead 24 is an outer portion 42, illustrated in FIG. 2, which extends away from central portion 36 and chip 12. Upon forming a package body for device 10, outer portions 42 will also extend out of the package body into a predetermined lead configuration. While an actual package body is not illustrated in FIG. 1, a package outline 44 is included for reference. Outer portion 42 of lead 24 includes an opening 48. The opening is provided to improve adhesion between the lead and the package body material, but is not necessary in practicing the invention.

Device 10 illustrated in FIG. 1 also includes various alignment features. In particular, several leads are provided with chip alignment features 50. Chip alignment features 50 are protrusions which extend from the leads, and define the appropriate position of chip 12. In bonding chip 12 to leadframe 16, an automated tool or human operator can use alignment features 50 to properly position the chip relative to the leadframe. In device 10, eight leads have the alignment features, each being aligned to one side of the chip. It is not necessary that eight leads be equipped with alignment features to ensure proper alignment. For example, two or more features which are aligned to either a side or a corner of the chip may be used to determine position of the chip.

Tape alignment features 52 are also included in areas of leadframe 16. Tape alignment features 52 are implemented in a similar manner as chip alignment features 50. An adhesively coated insulating tape is typically attached first to a leadframe. The leadframe, having the tape attached thereto, is then aligned and bonded to a semiconductor chip. The tape alignment features illustrated in FIG. 1 aid automated manufacturing equipment and human operators in determining the proper position of insulating tape 18 relative to leadframe 16. Tape alignment features are provided on both leads 24 and on support members 26. As mentioned with respect to the chip alignment features, the specific number of tape alignment features used can vary and the features can be aligned to either a side of insulating tape 18 or to a tape corner.

Figure 3:
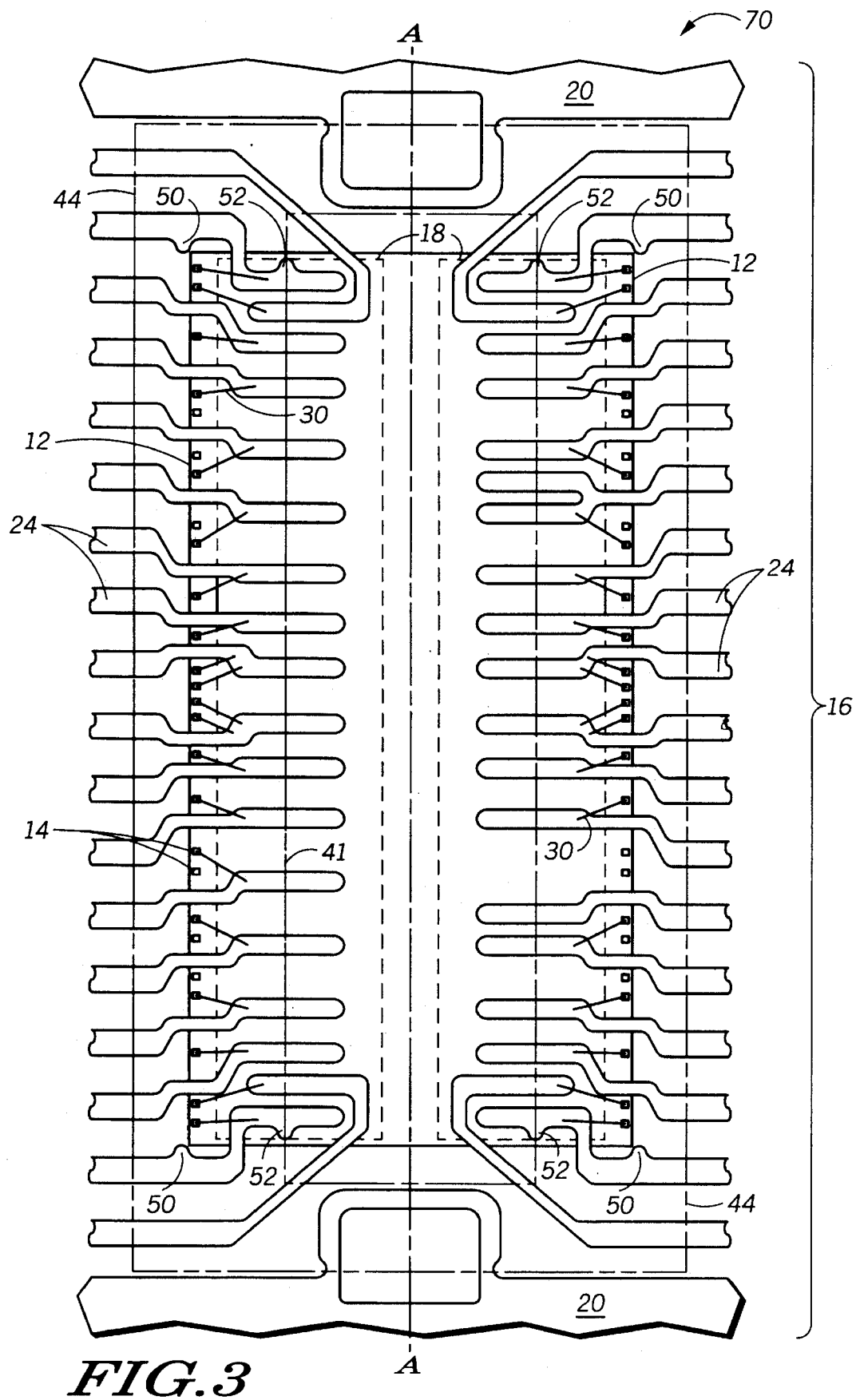
FIG. 3 is a plan view of a semiconductor device in accordance with another embodiment of the present invention.

Illustrated in FIG. 3 is a plan view of a semiconductor device 70, also in accordance with the present invention. Elements of device 70 which are analogous to elements of device 10 are referenced by the same numerals as in FIG. 1. Some differences between device 10 and device 70 are that device 70 does not have a tie bar and that bond pads 14 of device 70 are peripheral, but only along two sides of chip 17. As discussed previously, tie bars are not necessary in LOC applications. However, in one embodiment of the present invention, tie bars are used to distribute power in a device and serve to improve the adhesion of the leadframe to other device elements. Semiconductor memory devices often have bond pads on only two sides of a chip. FIG. 3 illustrates one way in which the present invention can be used in conjunction with such a memory device. Other distinctive features of device 70 are the utilization of two insulating tapes 18 rather than one, and an internal, rectangular clamping area 41 rather than a cross-shaped clamping area.

As in previous embodiments, leads 24 of device 70 are spaced between bond pads 14. Conductive wires 30 are used to electrically couple the central portions of the leads, while inner portions of the leads extend inward toward centerline A—A. Both of these aspects enable a device in accordance with the present invention to have several advantages over conventional LOC devices. For instance, a device in accordance with the present invention has improved adhesion between a leadframe, a semiconductor chip, an adhesive tape, and a molded resin packaging material. A primary reason for this advantage is an overall increase is leadframe surface area. Aspects of the present invention which contribute to the increase in leadframe surface area are the extension of leads from the wire bonded portion toward the center of the chip, the use of a tie bar, and making inner portions of the leads wider than the minimum lead width. Using a tie bar also creates a convenient way of distributing power in the device. Another advantage of the present invention is that it is applicable to chips having peripheral bond pads. In accordance with the present invention, leads are interspersed with peripheral bonds pads. Thus, chips which are used in an LOC implementation may also be used in other packages without having to re-design or re-layout the chip. Yet another advantage of the present invention is the ability to clamp inner portions of leads which overlie a chip during wire bond to reduce lead movement, thereby improving bonding accuracy. Furthermore, accuracy of attaching a chip or an adhesive tape to a leadframe in accordance with the present invention is improved by the use of alignment features included on leads and other leadframe members.

Thus it is apparent that there has been provided, in accordance with the invention, a lead-on-chip (LOC) semiconductor device and method for making the same that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention is not limited to devices having a dual-in-line or SOJ (small outline J-lead) lead configuration as illustrated. The invention may be practiced with semiconductor devices with leads on any number of sides of a package body. In addition, a device in accordance with the invention is not limited to a specific number of leads, bond pads, chips, etc. Nor is the invention limited to any specific types of materials or types of semiconductor chips. It is also important to note that bond pads along the "periphery" and "peripheral" bond pads as referenced herein do not exclude the use of non-peripheral bond pads, and does not imply that pads must lie along the entire periphery. Although a molded resin package has been specifically mentioned, the present invention is not limited to any specific package type. Furthermore, a centerline of a chip need not bisect two short sides of the chip as illustrated herein. A centerline of a semiconductor chip may bisect any two opposing sides of a chip in accordance with the present invention. Moreover, an electrically insulating adhesive material used in accordance with the present invention can be selected to provide alpha particle protection. Therefore, it is intended that this invention encompass all such variations and modifications as fall within the scope of the appended claims.

We claim:

1. A method for making a semiconductor device comprising the steps of:

providing a semiconductor chip having an active surface, a centerline, a periphery, and a plurality of bond pads formed on the active surface of the chip along the periphery;

providing a leadframe having a plurality of leads, each lead having an inner portion;

adhesively bonding the chip to the leadframe such that the inner portions of the plurality of leads overlie the active surface and extend toward the centerline of the chip;

positioning the leadframe having the chip attached thereto in a wire bonding apparatus having a clamping tool;

simultaneously clamping the inner portions of the plurality of leads against the active surface of the chip with the clamping tool to prohibit substantial movement of the leads; and wire bonding unclamped portions of each of the plurality of leads to one of the plurality of bond pads.

2. The method of claim 1 further comprising the step of aligning the periphery of the chip to one or more protrusions formed on sides of the plurality of leads, prior to the step of adhesively bonding the chip to the leadframe.

3. The method of claim 1 wherein the step of providing a leadframe comprises providing a leadframe having a tie bar, wherein the step of adhesively bonding comprises adhesively bonding the chip to the leadframe such that the tie bar traverses the active surface, and wherein the method further comprises the step of wire bonding the tie bar to at least one bond pad.

4. The method of claim 1 wherein the step of wire bonding comprises wire bonding the plurality of leads to the plurality of bond pads such that all wire bonds are contained within the chip periphery.

5. A method for making a semiconductor device comprising the steps of:

provided a semiconductor chip having an active surface, a plurality of bond pads formed on the active surface, four sides, and four corners;

providing a leadframe having a plurality of leads, wherein at least two leads of the plurality of leads each have a protrusion formed on a side of the lead;

positioning the leadframe over the active surface of the chip;

aligning the protrusions of the at least two leads to either a side or a corner of the chip;

adhesively bonding the plurality of leads to the active surface of the chip in the aligned position;

simultaneously clamping the inner portions of the plurality of leads against the active surface of the chip; and wire bonding the plurality of leads to the plurality of bond pads.

6. The method of claim 5 wherein the step of providing a leadframe comprises providing a leadframe wherein four leads have a protrusion on a side thereof, and wherein the step of aligning comprises aligning the protrusions of the four leads to either a side or a corner of the chip.

7. The method of claim 5 wherein the step of providing a leadflame comprises providing a leadframe wherein a first lead and a second lead adjacent to the first lead each have a protrusion formed on a side thereof, and wherein the step of aligning comprises aligning the protrusion of the first lead to a first side of the chip and aligning the protrusion of the second lead to a second side of the chip which is adjacent the first side.

8. The method of claim 5 further comprising the step of bonding an adhesive material to the plurality of leads, prior to bonding the plurality of leads to the active surface of the chip.

9. The method of claim 8 wherein the step of bonding an adhesive material comprises:

providing an adhesive material having a side and a corner;

aligning either the side or the corner of the adhesive material to protrusions formed on sides of at least two leads of the plurality of leads; and bonding the adhesive material to the plurality of leads in the aligned position;

wherein the lead protrusions aligned to the adhesive material are different than the lead protrusions aligned to the chip.

10. A method for making a semiconductor device comprising the steps of:

providing a semiconductor chip having an active surface, a periphery, and a plurality of bond pads formed on the active surface of the chip along the periphery;

providing a plurality of leads, each lead having an inner portion, a central portion, and an outer portion;

bonding the plurality of leads to active surface of the chip such that the inner and central portions overlie the active surface, such that the inner portions extend inward from the periphery, and such that the outer portions extend outward from the periphery;

simultaneously clamping the inner portions of the plurality of leads against the active surface; and wire bonding the plurality of leads to the plurality of bond pads.

11. The method of claim 10 further comprising the step of providing a tie bar traversing the active surface of the chip, and wherein the step of clamping comprises clamping the tie bar against the active surface simultaneously with the plurality of leads.

12. The method of claim 11 wherein the step of providing a tie bar comprises providing a tie bar having two opposing sides and a support member extending from each of the two opposing sides.

13. The method of claim 11 further comprising the step of wire bonding the tie bar to at least one of the plurality of bond pads.

14. A method for making a semiconductor device comprising the steps of:

providing a semiconductor chip having a periphery and an active surface, the active surface having a centerline which intersects two opposing sides of the chip and having a plurality of bond pads along the periphery;

providing a leadframe having a plurality of leads, each lead comprising an inner portion, an outer portion, and a central portion connecting the inner and outer portions;

positioning the leadframe over the active surface of the chip such that the plurality of leads are interspersed with the plurality of bond pads, such that the inner portions of the leads overly the active surface and extend from the central portions toward the centerline, such that the central portions overly the active surface, and such that the outer portions extend from the central portions off the active surface;

clamping the inner portions of the plurality of leads against the active surface of the chip; and wire bonding the central portions of each lead to a bond pad.

15. The method of claim 14 wherein the step of positioning comprises adhesively bonding the inner portions of the leads to the active surface of the chip.

16. The method of claim 14 wherein the step of clamping comprises clamping only the inner portions of the leads against the active surface of the chip, during the step of wire bonding.

17. The method of claim 14 wherein the step of providing a leadframe comprises providing a leadflame having a tie bar, wherein the step of clamping comprises clamping the tie bar against the active surface of the chip, and further comprising the step of wire bonding the tie bar to a bond pad.

18. The method of claim 14 wherein the step of providing a semiconductor die comprises providing a semiconductor die having four sides and having bond pads along all four sides.

* * * * *